(12) United States Patent
Haddad et al.

(10) Patent No.: US 6,275,415 B1
(45) Date of Patent: Aug. 14, 2001

(54) MULTIPLE BYTE CHANNEL HOT ELECTRON PROGRAMMING USING RAMPED GATE AND SOURCE BIAS VOLTAGE

(75) Inventors: Sameer S. Haddad, San Jose; Ravi S. Sunkavalli, Santa Clara; Wing Han Leung; John Chen, both of Cupertino; Ravi Prakash Gutala, Milpitas; Colin Bill, Cupertino; Vei-Han Chan, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/416,563

(22) Filed: Oct. 12, 1999

(51) Int. Cl.$^7$ ..................................... G11C 16/04
(52) U.S. Cl. .................. 365/185.11; 365/185.14
(58) Field of Search .................. 365/185.11, 185.14, 365/185.19, 185.21, 185.23, 185.26, 185.28

(56) References Cited

U.S. PATENT DOCUMENTS

| | | | |
|---|---|---|---|
| 5,508,958 | * 4/1996 | Fazio et al. | 365/185.19 |
| 5,615,153 | * 3/1997 | Yiu et al. | 365/185.19 |
| 5,687,116 | * 11/1997 | Kowshik et al. | 365/185.03 |
| 5,856,946 | * 1/1999 | Chan et al. | 365/185.19 |
| 6,034,895 | * 3/2000 | Naura et al. | 365/185.19 |
| 6,038,174 | * 3/2000 | Khan et al. | 365/185.28 |
| 6,040,996 | * 3/2000 | Kong | 365/185.19 |
| 6,052,310 | * 4/2000 | Sunkavalli | 365/185.29 |
| 6,055,183 | * 4/2000 | Ho et al. | 365/185.09 |
| 6,091,636 | * 7/2000 | Lie et al. | 365/185.19 |
| 6,097,639 | * 8/2000 | Choi et al. | 365/185.28 |

* cited by examiner

Primary Examiner—Richard Elms
Assistant Examiner—Anh Phung
(74) Attorney, Agent, or Firm—H. Donald Nelson

(57) ABSTRACT

A memory device having multiple banks, each bank having multiple memory cells and a method of programming multiple memory cells in the device wherein a bias voltage is applied to a common source terminal of the multiple memory cells and a time varying voltage is applied to gates of the memory cells that are to be programmed. In one embodiment, the voltage applied to the gates of the memory cells to be programmed is a ramp voltage. In a second embodiment, the voltage applied to the gates of the memory cells to be programmed is an increasing step voltage. In another embodiment, the bias voltage applied to the common source terminal and the voltage applied to the control gates of the memory cells to be programmed are selected so that the current flowing through cells being programmed is reduced and that the leakage current from memory cells that are not to be programmed is substantially eliminated. In another embodiment, a bias voltage is applied to the common source terminal and a bias voltage is applied to the common well voltage. The combination of the voltages applied to the control gates and to the sources decreases loading on the bitlines to ensure that $V_{DS}$ does not fall below a required level necessary for the maintenance of the hot carrier effect during programming. A bias voltage can also be applied to the wells of the memory cells while the common source terminal is held at ground. Feedback control of the programming gate voltages can be used to control the power required for programming.

24 Claims, 7 Drawing Sheets

MULTIPLE BYTE CHANNEL HOT ELECTRON PROGRAMMING USING RAMPED GATE AND SOURCE BIAS VOLTAGE

BACKGROUND OF THE INVENTION

1. Field of the Invention

This invention relates generally to programmable semiconductor memories. More specifically, this invention relates to power management during programming of programmable semiconductor memories that allows multiple bytes of programmable semiconductor memories to be programmed simultaneously. Even more specifically, this invention relates to power management during programming of programmable semiconductor memories using a combination of a time-varying control gate voltage and a source bias voltage to decrease loading in the bitlines by reducing current from cells being programmed and by minimizing or eliminating leakage current from cells that are not being programmed.

2. Discussion of the Related Art

One type of programmable memory cell is commonly referred to as a flash memory cell. The structure of one type of flash memory cell includes a source and a drain formed in a silicon substrate. The structure of another type of flash memory cell includes a source and a drain formed in a well that is formed in a silicon substrate. The flash memory cell includes a stacked gate structure formed on the silicon substrate. The region of the silicon substrate beneath the stacked gate structure is known as the channel region of the flash memory cell.

The stacked gate structure of a flash memory cell includes a pair of polysilicon structures separated by oxide layers. One of the polysilicon structures functions as a floating gate and the other polysilicon structure functions as a control gate for the flash memory cell. The oxide layer that separates the floating gate from the silicon substrate is commonly referred to as a tunnel oxide layer.

Prior programming operations on a flash memory cell involve the application of a relatively large constant voltage to the drain of the flash memory cell while an even larger voltage is applied to the control gate. During such programming operations, the source of the flash memory cell is maintained at a ground level or a zero voltage level in relation to the voltages applied to the control gate and drain.

Such a relatively high voltage potential applied between the drain and source causes electrons to flow through the channel region from the source to the drain. The electrons flowing between the source and drain can attain relatively high kinetic energy levels near the drain. In addition, the high constant voltage applied to the control gate raises the voltage potential of the floating gate to a high level at the start of the programming operation and a relatively high programming current in the cell being programmed results. Under these conditions, electrons in the channel region having sufficiently high kinetic energy migrate through the tunnel oxide layer and onto the floating gate. This phenomenon is referred to as hot carrier programming or hot carrier injection. A successful programming operation involves the injection of sufficient numbers of electrons onto the floating gate to achieve a desired threshold voltage for the flash memory cell. The threshold voltage is the voltage that must be applied to the control gate of a flash memory cell to cause conduction through the channel region during a read operation on the flash memory cell. The time involved in a programming operation depends upon the rate at which electrons are injected onto the floating gate. As can be appreciated, the slower the rate of injection the longer the programming time to reach the desired threshold voltage.

With such programming techniques, the relatively high voltage potential of the floating gate at the start of the programming operation is reduced as electrons accumulate on the floating gate. Such a reduction in the voltage potential of the floating gate causes a corresponding reduction in the rate of electron injection onto the floating gate. Such a reduction in the rate of electron injection increases the time required to program a flash memory cell to the desired threshold voltage. Such increased programming time slows the overall speed of flash memory devices that employ such programming techniques.

In addition, it is well known that a hot carrier programming technique results in the formation of electron-hole pairs in the channel region of the flash memory cell near the drain. The electron-hole pairs are formed when high-energy electrons bombard the crystal lattice structure of the silicon substrate and dislodge other electrons from the lattice. Moreover, the portions of the channel region near the drain usually have a relatively high voltage potential due to the high voltage applied to the drain. As a consequence, the voltage potential of the floating gate can fall below the voltage potential of the portion of the channel region located near the drain as the voltage level on the floating gate decreases during programming. Under this condition, holes from the electron-hole pairs that are created in the channel region near the drain can migrate throughout the tunnel oxide layer and onto the floating gate. Such migration of holes onto the floating gate causes surface damage to the tunnel oxide layer. Such surface damage usually causes long-term reliability problems in the flash memory cell by reducing the rate of injection of electrons onto the floating gate during programming. In addition, such surface damage can interfere with current flow through the channel region of the flash memory cell during a read operation that also results in a reduction in long-term reliability.

The microelectronic flash or block-erase Electrically Erasable Programmable Read-Only Memory (Flash EEPROM) includes an array of cells that can be independently programmed and read. The size of each cell and thereby the memory are made small by omitting transistors known as select transistors that would enable the cells to be erased independently. As a result, all of the cells must be erased together as a block.

A flash memory device of this type includes individual Metal-Oxide-Semiconductor (MOS) field effect transistor (FET) memory cells. Each of the FETs includes a source, a drain, a floating gate and a control gate to which various voltages are applied to program the cell with a binary 1 or 0, to read the cells, or to erase all of the cells as a block.

The cells are connected in an array of rows and columns, with the control gates of the cells in a row being connected to a respective wordline and the drains of the cells in a column being connected to a respective bitline. The sources of the cells are connected together. This arrangement is known as a NOR memory configuration.

A cell can be programmed by applying programming voltages as follows: a voltage, typically in the range of 9–10 volts to the control gate, a voltage of approximately 5 volts to the drain and grounding the source. As discussed above, these voltages cause hot electrons to be injected from a drain depletion region into the floating gate. Upon removal of the programming voltages, the injected electrons are trapped in the floating gate and create a negative change therein that increases the threshold voltage of the cell to a value in excess of approximately 4 volts.

A cell can be read by applying a voltage of about 5 volts to the control gate, applying about 1 volt to the bitline to which the drain is connected, grounding the source, and sensing the bitline current. If the cell is programmed and the threshold voltage is relatively high (4 volts), the bitline current will be zero or at least relatively low. If the cell is not programmed or erased, the threshold voltage will be relatively low (2 volts), the control gate voltage will enhance the channel, and the bitline current will be relatively high.

A cell can be erased in several ways. In one arrangement, applying a relatively high voltage, typically 12 volts, to the source, grounding the control gate and allowing the drain to float erases a cell. This causes the electrons that were injected into the floating gate during programming to undergo Fowler-Nordheim tunneling from the floating gate through the thin tunnel oxide layer to the source. Applying a negative voltage on the order of −10 volts to the control gate, applying 5 volts to the source and allowing the drain to float can also erase a cell. Another method of erasing a cell is by applying 5 volts to the P-well and −10 volts to the control gate while allowing the source and drain to float.

A problem with conventional flash EEPROM cells is that because of manufacturing tolerances, some cells become over-erased before other cells become sufficiently erased. The floating gates of the over-erased cells are either completely or partially depleted of electrons and have a very low negative charge or become positively charged. The over-erased cells can function as depletion mode transistors that cannot be turned off by normal operating voltages applied to their control gates and introduce leakage current to the bit line during subsequent program and read operations. The slightly overerased cells can introduce varying amounts of leakage current to the bitline depending upon the extent of overerasure.

More specifically, during program and read operations only one wordline is held high at a time, while the other wordlines are grounded. However, because a positive voltage is applied to the drains of all of the cells and if the threshold voltage of an unselected cell is very low, zero or negative, a leakage current will flow through the source, channel and drain of the unselected cell.

The undesirable effect of a high bitline current flowing during programming and the concomitant loading is illustrated in FIG. 6, which is a simplified electrical schematic diagram of a column 600 of flash EEPROM cells 602, 604, 606, and 608. The gate of the pass transistor TP is connected to a Y Decoder 610 that provides a logic signal to select or unselect the column 600 of cells. The source of the pass transistor TP is connected to the bitline BL and the drain of the pass transistor is connected to the Bitline Driver 612 that is connected to the Logic Circuit 614. A voltage is applied to the bitline BL via the Logic Circuit 614 and the Bitline Driver 612 that outputs a logic signal to the drain of the NMOS pass transistor TP.

In an application in which $V_{CC}$ is sufficiently high, for example 5 volts, to drive the bitline BL, the bitline driver 612 outputs $V_{CC}$. In an application in which $V_{CC}$ is lower than 5 volts, for example 3 volts, the bitline driver 612 connects the output of a charge pump (not shown), which generates a voltage that is higher than $V_{CC}$, preferably on the order of 4 to 5 volts.

The sources of the column 600 of transistors are all connected to a source supply voltage $V_S$. It will be noted that although only one pass transistor TP is illustrated in FIG. 6, a flash EEPROM device can include more than one pass transistors connected in series, enabling bank or sector selection as described with reference to FIG. 1B. The bitline BL is selected by controlling the Y Decoder 610 to apply a logically high signal to the gate of the pass transistor TP. When the pass transistor TP is turned on, the drains of the column 600 of cells are connected through the pass transistor TP and the bitline driver 612 to $V_{CC}$ or to the charge pump in a low $V_{CC}$ application.

Although the bitline voltage is typically 4–5 volts, there is a voltage drop $V_P$ across the pass transistor TP so that the actual voltage applied to the drains of the cells connected to the bitline BL has a value that is lower than the voltage $V_{CC}$ by the voltage drop $V_P$. For programming, the bitline voltage $V_{DS}$ must be maintained above a certain value that depends on the characteristics of the cells in a particular application in order to maintain the hot carrier field during programming. In addition, the bitline voltage must be above a certain level to prevent the cells from becoming unstable and unreliable due to insufficient horizontal electrical field. The bitline voltage $V_{DS}$ is required to be above a certain value, for example, a value of approximately 4 volts. If the current through the cells being programmed is high and if there is substantial background leakage, the increased drain current of the cells connected to the bitline BL will flow through the pass transistor TP and increase the voltage drop $V_P$. In a conventional flash EEPROM this increased voltage drop can bring the bitline voltage below 4 volts and produce an unacceptable reduction in speed and/or other undesirable effects.

A programming voltage $V_{CG}$ is applied to the control gate of the transistor 604, which turns it on. A programming current $I_2$ flows through the transistor 604 from ground through its source, channel (not shown) and drain and through the bitline BL to the bitline driver 612. Ideally, the bitline current $I_{BL}$ is equal to only $I_2$. However, if one or more of the unselected transistors, for example transistors 602, 606 or 608 as illustrated in FIG. 6, are overerased or slightly overerased, their threshold voltages will be very low, zero or even negative, and background leakage currents $I_1$, $I_3$, and $I_4$ could flow through the transistors 602, 606, and 608, respectively. The bitline current $I_{BL}$ would then be equal to the sum of $I_2$ and the background leakage currents $I_1$, $I_3$ and $I_4$.

As the bitline current $I_{BL}$ is increased because of large programming currents through cells being programmed and because of background leakage current through cells not being programmed, the voltage drop $V_P$ increases and may cause $V_{DS}$ to drop below the desired value. The inventors of the present invention have discovered that by selecting the proper combination of the time-varying programming voltage $V_{CG}$ applied to the control gate of the transistors being programmed and the bias voltage applied to the sources of all of the transistors, current in the cells being programmed is reduced and the leakage current in the cells not being programmed can be substantially, if not entirely eliminated.

The inventors of the present invention have further discovered that by selecting the proper combination of the time-varying programming voltage $V_{CG}$ applied to the control gate of the transistors being programmed and the bias voltage applied to the sources of all the transistors in more than one bank of memory cells, current in the cells being programmed is reduced and the leakage current in the cells not being programmed can be substantially, if not entirely eliminated, allowing more than one bank of memory cells to be programmed simultaneously.

FIG. 7 illustrates how the threshold voltages of the cells or bits in a flash EEPROM can differ following an erase operation as shown by curve 700 that represents the number of cells having particular values of threshold voltage $V_T$. It will be seen that the least erased cells will have relatively high threshold voltages in the region of $V_T$MAX, whereas the most overerased cells will have low threshold voltages in the region of $V_T$MIN that can be zero or negative. The characteristic curve illustrated in FIG. 7 is known as the threshold voltage distribution.

FIG. 8 is a curve 800 illustrating how the background leakage current of a cell varies as a function of threshold voltage. The lower the threshold voltage, the higher the leakage current. It is therefore desirable to prevent cells from having low threshold voltages and to reduce the threshold voltage distribution to as low a range as possible.

In order to decrease programming time, it is desirable to program as many of the memory cells as possible during one programming cycle. As can be appreciated, multibit or multibyte programming involves a high number of memory cells and can require a relatively high current source. Because the typical programming operation involves placing the control gates of the memory cells that are not to be programmed at ground potential, placing the common drain at a moderately high voltage and because all of the memory cells have a common drain and a common source, a voltage potential is established between the drains and sources of the memory cells not being programmed. The voltage potential established between the drains and sources of the memory cells not being programmed could result in a small but finite leakage current flowing from each memory cell not being programmed to the common drain terminal. Because the total programming current made up of the current flowing through cells being programmed and the leakage current flowing through cells not being programmed limits the number of memory cells that can be programmed at the same time, it is desirable to limit the power required during programming. Effective power management can be achieved by reducing the programming current flowing through the cells being programmed and by substantially limiting or eliminating the leakage current so that more memory cells can be programmed simultaneously thereby decreasing the total programming time.

Therefore, what is needed is an effective method of power management during programming by a method of programming multibyte flash memory cells that reduces the current flowing through cells being programmed and that substantially limits or eliminates the leakage current flowing through cells not being programmed, that increases the programming speed and that does not reduce the long term reliability.

SUMMARY OF THE INVENTION

According to the present invention, the foregoing and other objects and advantages are achieved by a device and method of programming memory cells in a multiple bank flash Electrically-Erasable Programmable Read Only Memory (EEPROM) device. The flash memory cells are programmed by applying a voltage to a common drain terminal, by applying a bias voltage to a common source terminal and by applying a time varying voltage to the control gates of memory cells that are to be programmed.

In accordance with another aspect of the invention, the bias voltage is applied to a common well terminal.

In still another aspect of the invention, the bias voltage is a combination of a bias voltage applied to a common source terminal and a bias voltage applied to the common well terminal.

In accordance with another aspect of the invention, multiple banks are programmed simultaneously.

In accordance with another aspect of the invention, the voltage that is applied to the control gates of the memory cells that are to be programmed is a ramp function voltage.

In accordance with still another aspect of the invention, the voltage that is applied to the control gates of the memory cells that are to be programmed is a steadily increasing step function.

In accordance with another aspect of the invention, the bias voltage applied to the common source terminal and the time-varying voltage applied to the control gates of the memory cells that are to be programmed are selected to minimize the power required for programming.

In accordance with yet another aspect of the invention, the bias voltage applied to the common source terminal and the time-varying voltage applied to the control gates of the memory cells that are to be programmed are selected such that the programming current in the cells being programmed is below the programming current that would flow in the cells being programmed without the application of the time-varying voltage applied to the control gates of the cells being programmed and the leakage current in cells not being programmed is below the leakage current flowing in the cells not being programmed when there is no bias voltage applied to the common source terminal.

In accordance with another aspect of the invention, feedback control of the voltage applied to the control gates of the cells being programmed is utilized by monitoring the bitline current. The programming control gate voltage is adjusted to maintain the programming current below a predetermined value.

The described method and device thus provides a method of managing power requirements for the programming of flash EEPROM cells that reduces current flowing in cells being programmed and that minimizes background leakage current flowing in cells not being programmed so that multiple memory cells can be programmed simultaneously and that maintains programming speed and maintains cell reliability.

The present invention is better understood upon consideration of the detailed description below, in conjunction with the accompanying drawings. As will become readily apparent to those skilled in the art from the following description, there is shown and described embodiments of this invention simply by way of illustration of the best modes to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION

Reference is now made in detail to specific embodiments of the present invention that illustrate the best modes presently contemplated by the inventors for practicing the invention.

Figure 1A:
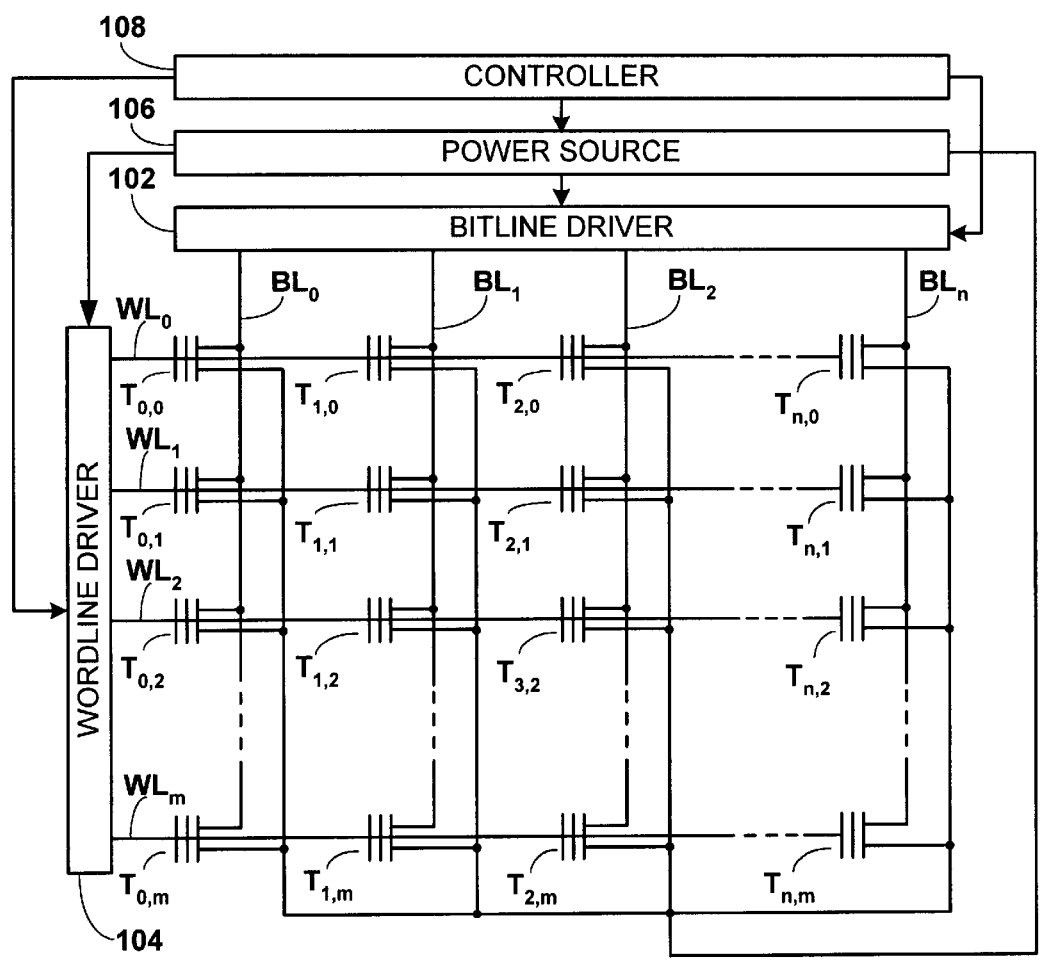
FIG. 1A is a simplified electrical schematic diagram of a flash EEPROM.

FIG. 1A illustrates a basic configuration of a NOR type flash Electrically Erasable Programmable Read-Only Memory (EEPROM) 100 to which the present invention is advantageously applied. The flash memory 100 comprises a plurality of core or memory cells, which are arranged in a rectangular matrix or array of rows and columns. Each row is associated with a wordline (WL), whereas each column is associated with a bitline (BL).

Assuming that there are n columns and m rows, the bitlines are designated as $BL_0$ to $BL_n$ and the wordlines are designated as $WL_0$ to $WL_m$. Appropriate voltages are applied to the bitlines by a bitline driver 102, whereas appropriate voltages are applied to the wordlines by a wordline driver 104. The voltages applied to the drivers 102 and 104 are generated by a power source 106 under the control of a controller 108, which is typically on-chip logic circuitry. The controller 108 also controls the drivers 102 and 104 to address the memory cells individually or collectively as will be described below.

A memory cell is located at each junction of a wordline and a bitline. Each cell includes a Metal-Oxide-Semiconductor (MOS) Field Effect Transistor (FET) having a source and drain formed in a semiconductor substrate, a floating gate, and a control gate separated from the floating gate by a layer of oxide. As should be appreciated, the cells of a flash EEPROM differ from conventional FETs in that they include the floating gate and tunnel oxide layer disposed between the control gate and the semiconductor substrate in which the source and drain are formed.

The cells illustrated in FIG. 1A are designated using the notation $T_{n,m}$, where m is the row (wordline) number and n is the column (bitline) number. The control gates of the cells are connected to respective wordlines, and the drains of the cells are connected to respective bitlines as illustrated. The sources of all of the cells are connected to the power source 106.

Figure 1B:
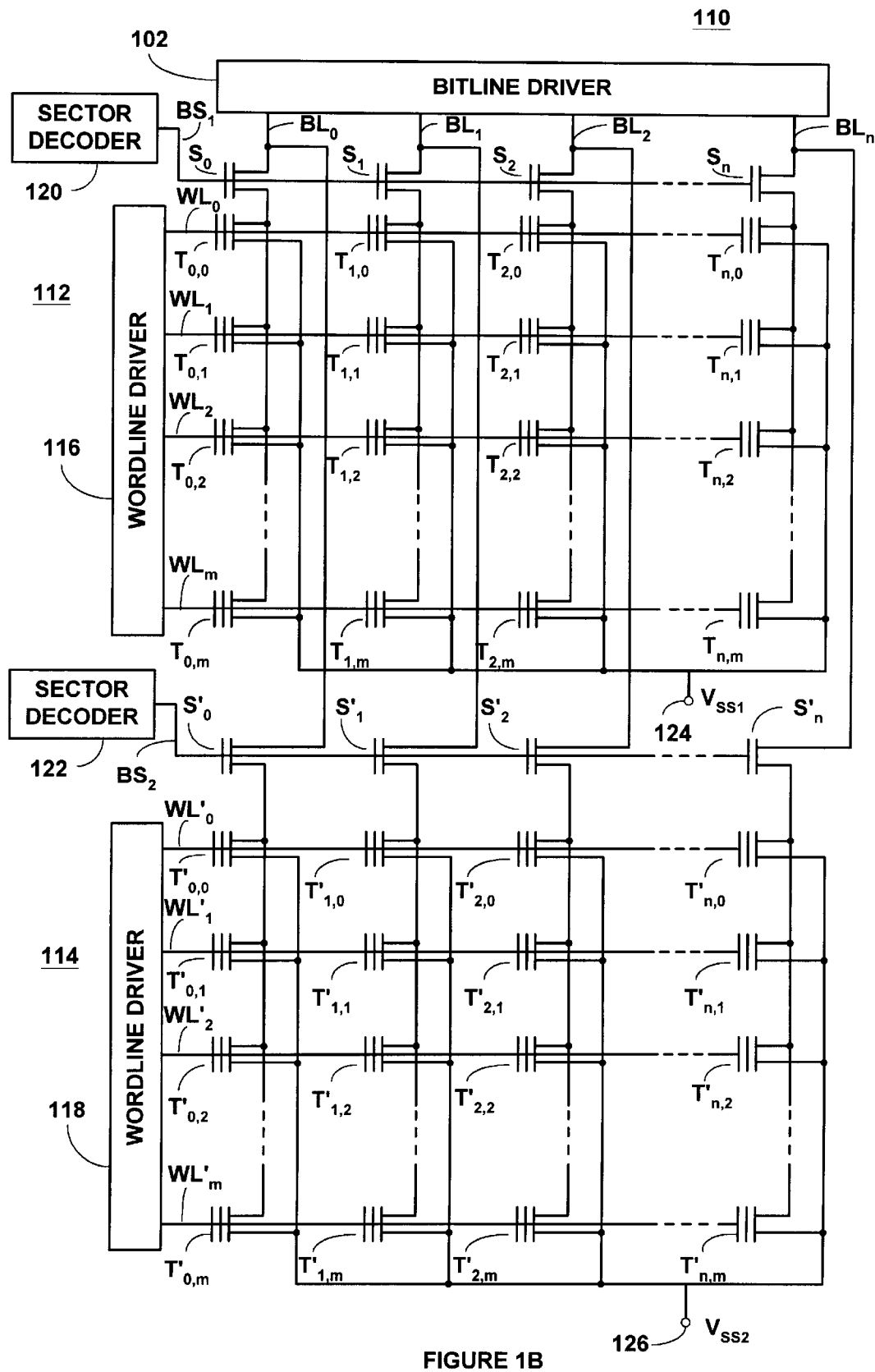
FIG. 1B is similar to FIG. 1A but illustrates a flash EEPROM having cells arranged in two pages or banks.

FIG. 1B illustrates another flash EEPROM memory 110 that is similar to the memory 100 except that the cells are divided into banks, (also known as pages or sectors), two of which are shown in FIG. 1B, each of which can be programmed, erased, and read independently. The memory 110 includes a first cell bank or page 112 and a second cell bank or page 114. The memory cells in the first bank 112 are designated in the same manner as in FIG. 1A, whereas a prime symbol is added to the designations of the cells in the second bank 114. The wordlines of the banks 112 and 114 are connected to separate wordline drivers 116 and 118, respectively.

In addition to the memory cells, each bank 112 and 114 includes a select or pass transistor for each bitline. The select transistors for the banks 112 and 114 are designated as $S_0$ to $S_n$ and $S'_0$ to $S'_n$, respectively. The drains of the select transistors are connected to the respective bitlines, whereas the sources of the select transistors are connected to the drains of the transistors for the wordlines $WL_0$ to $WL_m$ and $WL'_0$ to $WL'_m$.

The select transistors differ from the memory cell transistors in that they are conventional MOSFETs and therefore lack floating gates. The select transistors are switching elements rather than memory elements. The gates of the select transistors for the bank 112 are connected to a bank select $BS_1$ of a sector decoder 120 and the gates of the select transistors for the bank 114 are connected to a bank select output $BS_2$ of a sector decoder 122. The sources of the cells in bank 112 are connected to a common source supply voltage $V_{SS1}$ 124 and the sources of the cells in the bank 114 are connected to a common source supply voltage $V_{SS2}$ 126.

The bank 112 is selected by applying a logically high signal to the bank select line $BS_1$ that turns on the transistors $S_0$ to $S_n$ and connects the bitlines $BL_0$ to $BL_n$ to the underlying memory cells. The bank 112 is deselected by applying a logically low signal to the bank select line $BS_1$ that turns off the transistors $S_0$ to $S_n$ and disconnects the memory cells from the bitlines. The bank 114 is selected and deselected in an essentially similar manner using the bank select signal $BS_2$ and select transistors $S'_0$ to $S'_n$. The operation of the memory 110 is essentially similar to that of the memory 100 (FIG. 1A), except that the program, erase and read operations can be performed on the banks 112 & 114 independently or simultaneously.

Figure 2:
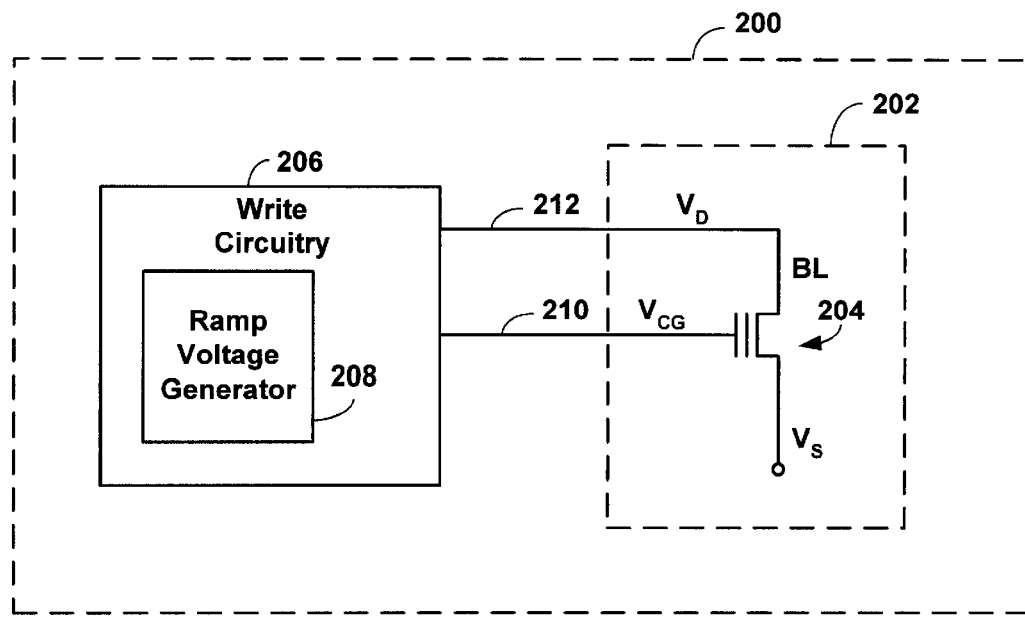
FIG. 2 illustrates a flash memory device having a ramp voltage generator for providing a ramped voltage to the control gate of the memory cells being programmed.

FIG. 2 illustrates a flash memory device 200. The flash memory device 200 includes an array 202 of flash memory cells, which for purposes of illustration, shows a single flash memory cell 204. The flash memory device 200 includes write circuitry 206 that performs programming operations on the array 202 of flash memory cells, including the flash memory cell 204. Each programming operation on the flash memory cell 204 is referred to as a programming cycle.

The write circuitry 206 programs the flash memory cell 204 by generating a time-varying control gate voltage during the programming cycle. The write circuitry 206 includes a ramp voltage generator 208. The ramp voltage generator 208 applies an increasing voltage potential to the control gate of the flash memory cell 204 via the signal path 210. The increasing voltage potential to the control gate may be a ramp voltage function or a step voltage function. During each programming cycle, the write circuitry 206 applies a substantially constant drain voltage to the flash memory cell 204 via the signal path 212.

The voltage applied to the drain of the flash memory cell 204 during programming is referred to as $V_D$ and the voltage applied to the control gate of the flash memory cell 204 during programming is referred to as $V_{CG}$. The ramp voltage generator 208 increases the control gate programming voltage $V_G$ during a programming cycle.

Figure 3:
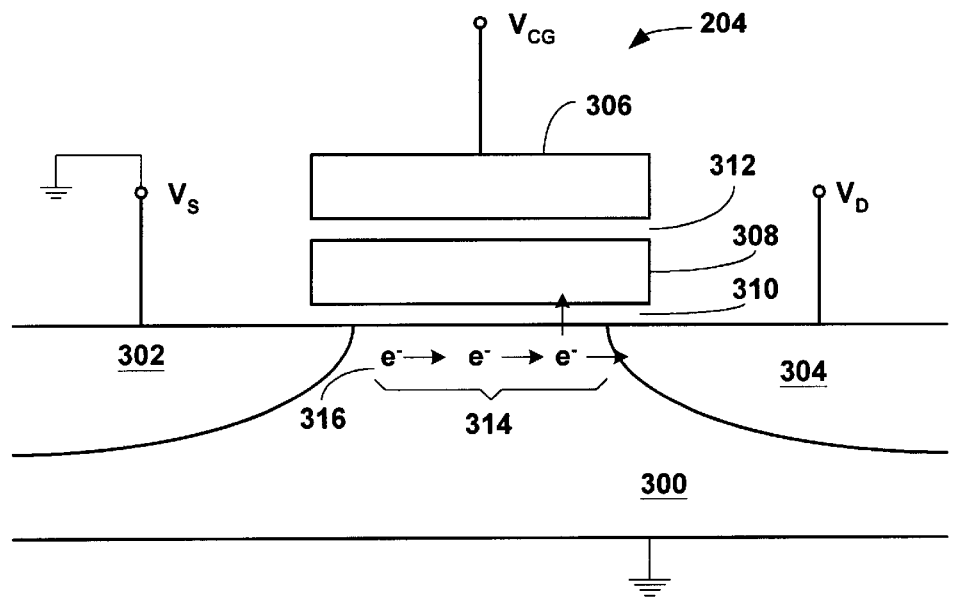
FIG. 3 illustrates the elements of the flash memory cell in a programming configuration.

FIG. 3 illustrates the elements of the flash memory cell 204 indicated in FIG. 2. The flash memory cell 204 is formed in and on a silicon substrate 300. In one embodiment, the silicon substrate 300 is a p-type substrate. The flash memory cell 204 includes a pair of doped regions 302 and 304 formed in the silicon substrate 300. In one embodiment, the doped regions 302 and 304 are $n^+$ type doped regions. The doped region 302 functions as a source and the doped region 304 functions as a drain during programming cycles on the flash memory cell 204.

The flash memory cell 204 includes a stacked gate structure comprising a control gate 306 and a floating gate 308. In one embodiment, the control gate 306 and the floating gate 308 are each formed from doped polysilicon. The floating gate 308 is separated from an upper surface of the substrate 300 by an oxide layer 310. The oxide layer 310 is also referred to as a tunnel oxide. The control gate 306 is separated from the floating gate 308 by an oxide layer 312.

The write circuitry 206 (FIG. 2) programs the flash memory cell 204 to a predetermined threshold voltage $V_t$ by applying a relatively constant drain voltage $V_D$ to the drain 304 while applying a ramp gate voltage $V_G(t)$ to the control gate 306. During programming cycles, a voltage is maintained on the source 302. In addition, the p-type substrate 300 is maintained at a low voltage level during programming cycles. As will be discussed below, the voltage differential between the drains and sources of cells not being programmed causes background leakage current that causes a high programming current to flow when multiple memory cells are being programmed. The high programming current causes loading in the bitlines that reduces the $V_{DS}$ required for the maintenance of the hot carrier field.

The voltage differential $V_{DS}$ between the drain 304 and the source 302 causes electron flow through a channel region 314 of the flash memory cell 204. The electrons are represented by $e^-$, at 316 in the channel region 314. Hot carrier injection occurs as high-energy electrons migrate through the oxide region 310 onto the floating gate 308. The path of a high-energy electron that migrates onto the floating gate 308 is represented by arrow 320.

Figure 4:
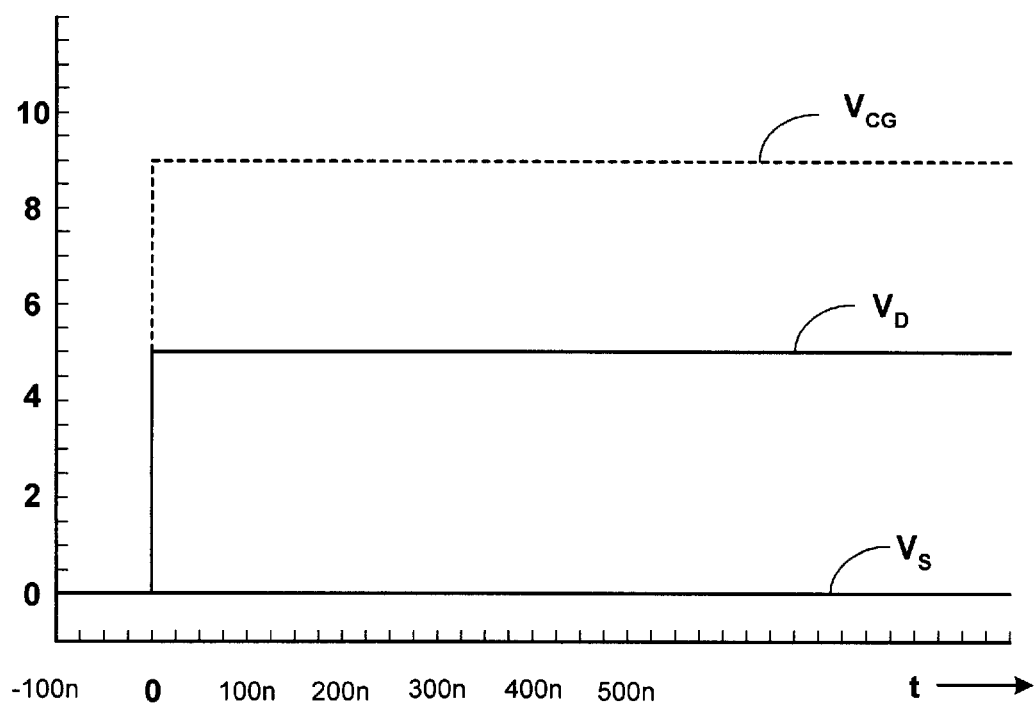
FIG. 4 illustrates the drain, control gate and source voltages applied to a flash memory cell using programming techniques found in the prior art.

FIG. 4 illustrates the voltages $V_S$, $V_{CG}$, and $V_D$ applied to a flash memory cell using prior art programming techniques. In prior art techniques, the control gate voltage $V_{CG}$ may or may not be varied or ramped during the programming cycle, the drain voltage $V_D$ is kept constant and the source voltage $V_S$ is kept constant.

Figure 5:
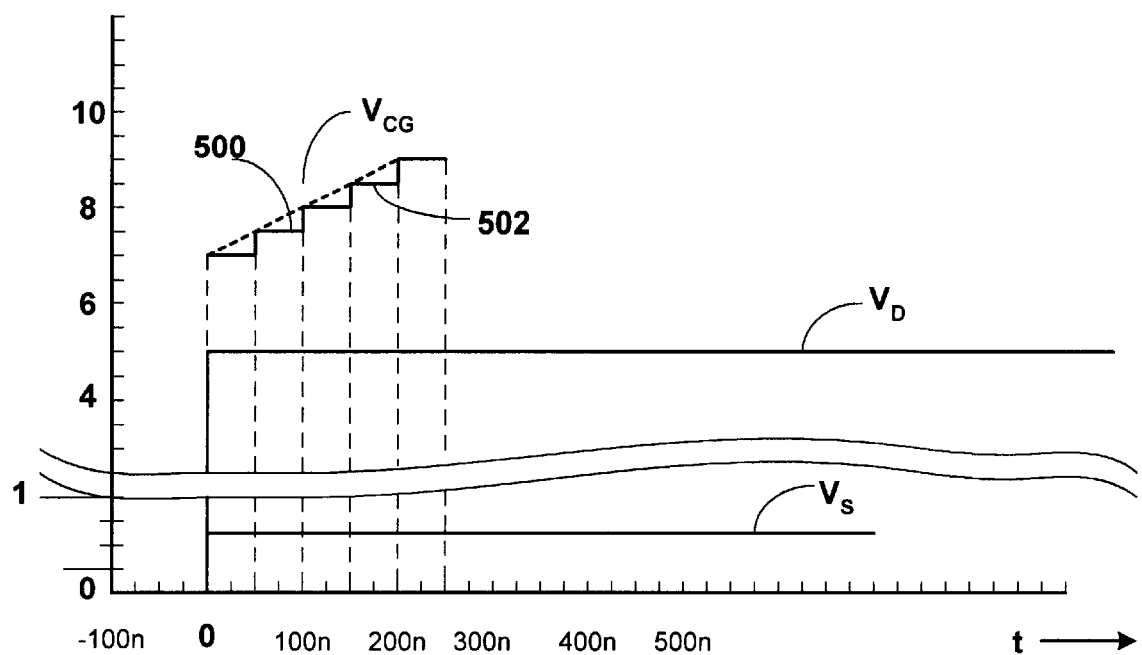
FIG. 5 illustrates the drain, control gate and source voltages applied to a flash memory cell using programming techniques in accordance with the present invention.

FIG. 5 illustrates the voltages $V_S$, $V_{CG}$, and $V_D$ applied to a flash memory cell using programming techniques in accordance with the present invention. The voltage $V_{CG}$ applied to the control gate is varied during the programming cycle. The voltage applied to the control gate $V_{CG}$ is increased from a given voltage, in one embodiment, from an initial voltage of approximately 7 volts. The initial control gate voltage $V_{CG}$ is selected to start programming and is ramped to a final voltage equal to the programming voltage of the flash memory cell. The programming voltage in one embodiment is approximately 9 volts. The voltage applied to the drain $V_D$ is held constant and in one embodiment is approximately 5 volts. The voltage applied to the source $V_S$ is biased at a value of approximately less than 1 volt. The source bias will be discussed below. The ordinate in FIG. 5 is shown having two voltage scales for clarity. The lower portion of the ordinate has a voltage scale of 0.25 volts per tick and the upper portion of the ordinate has a voltage scale of 0.5 volts per tick. It is noted that the voltage values shown in FIG. 5 are for illustrative purposes only and other voltage values can be used.

In one embodiment, the ramp voltage generator 208 (FIG. 2) generates a linear steadily increasing control gate voltage $V_{CG}(t)$ 500 during the programming cycle. In another embodiment, the ramp voltage generator 208 generates a series of step pulses, as indicated at 502, that closely simulate a ramp voltage function. The series of step pulses are shown to form a staircase type waveform that increases throughout the programming cycle on the flash memory cell 204.

Figure 6:
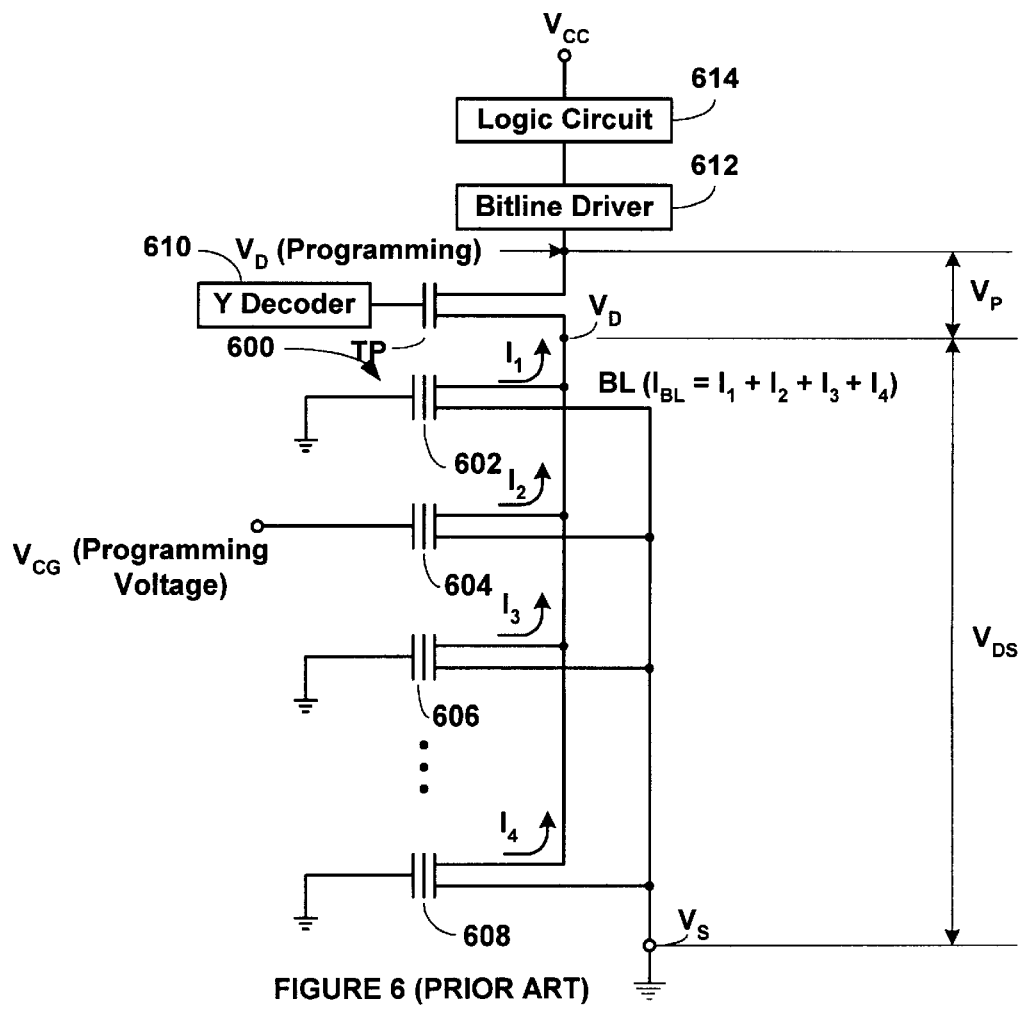
FIG. 6 is a simplified electrical schematic diagram of a column of flash EEPROM cells illustrating the leakage currents and increased loading across the pass transistor caused by the leakage currents.
Figure 7:
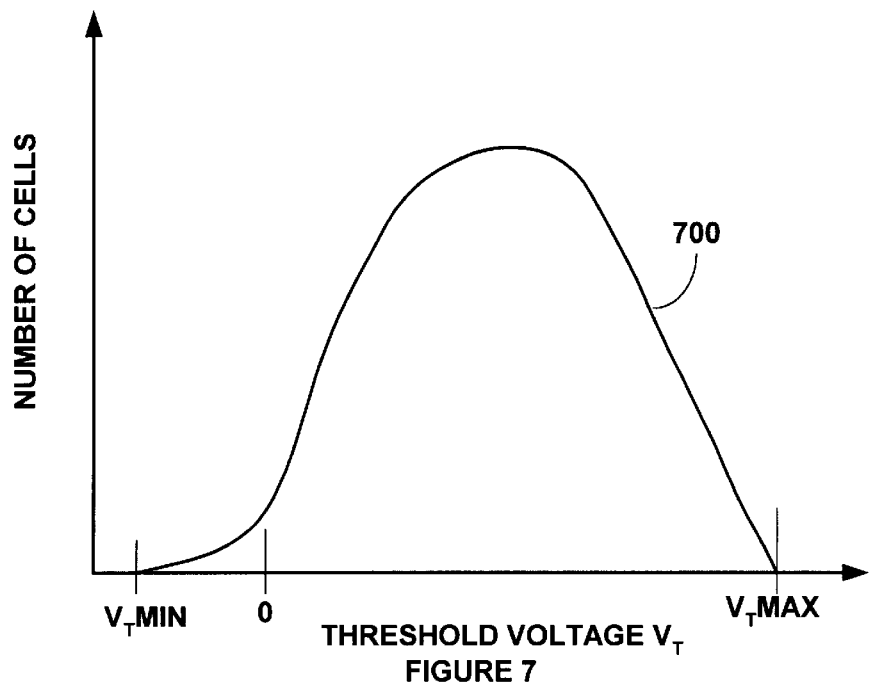
FIG. 7 is a graph illustrating a threshold voltage distribution in a flash EEPROM after an erase operation.
Figure 8:
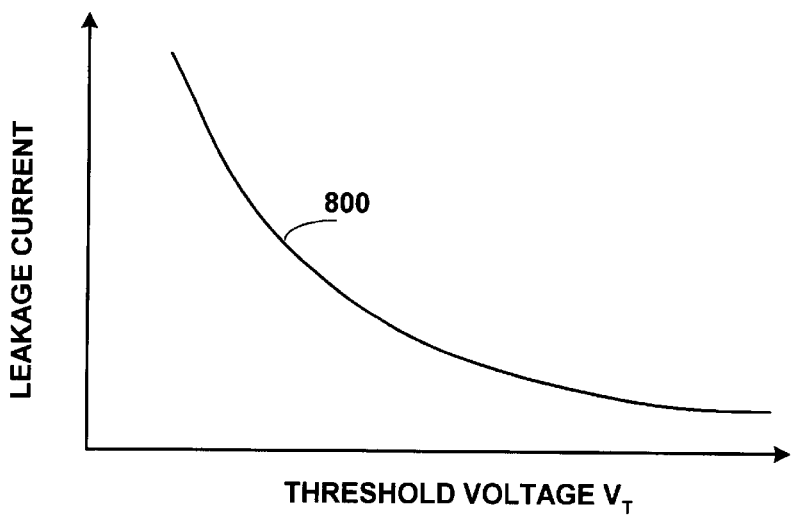
FIG. 8 is a graph illustrating how background leakage current varies as a function of threshold voltage for the least erased cells.
Figure 9:
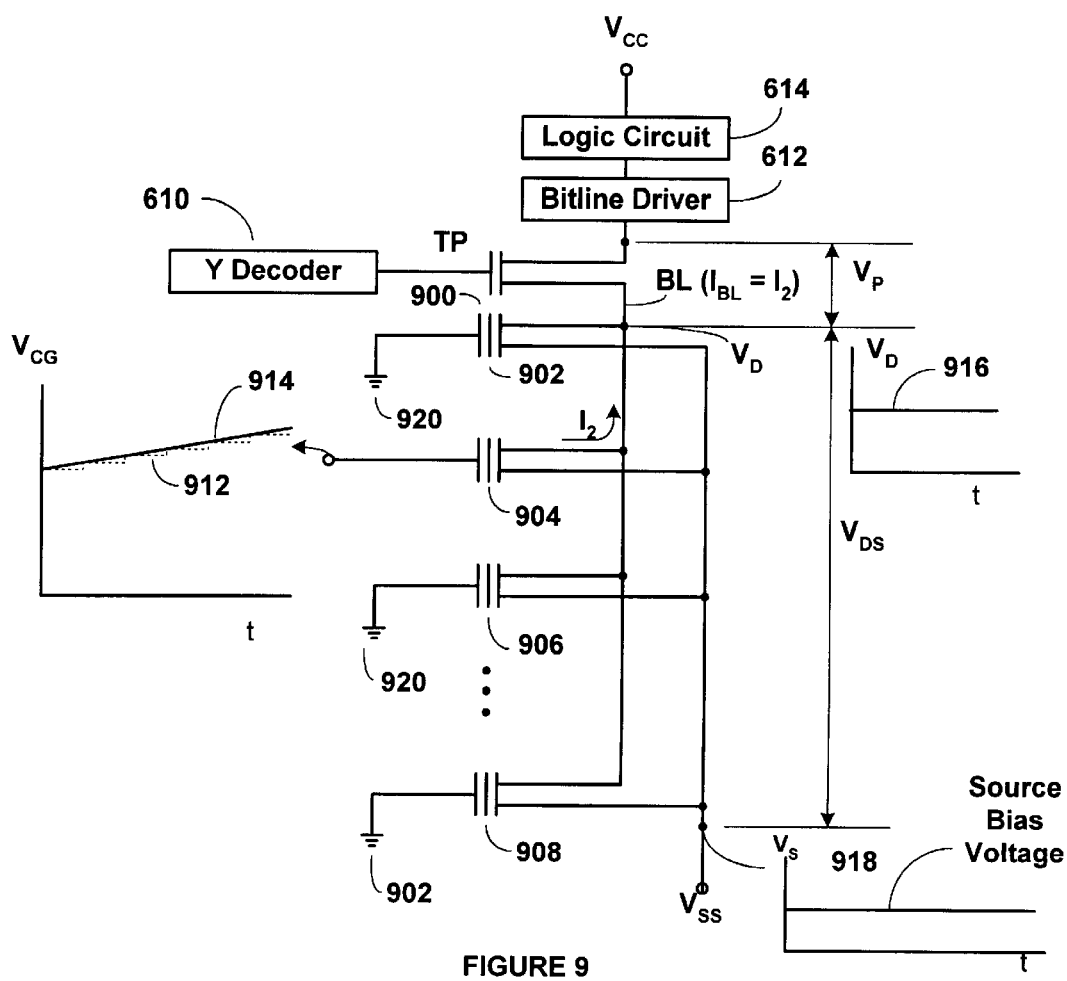
FIG. 9 is a simplified electrical schematic diagram of a column of flash EEPROM cells showing the control gate, source and drain voltages during the programming of one of the cells in accordance with the present invention.

FIG. 9 is a simplified electrical schematic diagram of a column 900 of flash EEPROM cells 902, 904, 906, and 908 showing the control gate, source and drain voltages during the programming of one of the flash memory cells according to the present invention. The operation of the Logic Circuit 614, the Bitline Driver 612 and the Y Decoder 610 are the same as described above in the discussion relating to FIG. 6. Applying a relatively high voltage $V_{CG}$ to the control gate programs the EEPROM cell 904. The voltage $V_{CG}$ can be applied as stepped voltage pulses as indicated at 912 or the voltage $V_{CG}$ can be applied as a ramped voltage as indicated at 914. A moderate voltage $V_D$ is applied to the drain as indicated at 916. A bias voltage $V_S$ is applied to the source as indicated at 918. The gates of the non-selected flash memory cells are grounded as shown at 920.

The amount of the bias voltage $V_S$ applied to the source and the voltage $V_{CG}$ applied to the control gate are adjusted so that the current flowing through the cells being programmed is reduced and the background leakage current flowing from cells not being programmed into the bitline is substantially eliminated so that the current in the bitline BL only has the component $I_2$, which has been reduced. Because the programming current has been reduced and the background leakage current has been virtually eliminated, the loading across the pass transistor TP is reduced to a minimum value and the voltage $V_{DS}$ is at a value that maintains the hot carrier field in the cell 904 being programmed. In addition, the proper combination of the bias voltage applied to the sources and the voltage $V_{CG}$ applied to the control gates of the cells being programmed is such that programming speed is not decreased. In addition, the decreased bitline current allows multiple banks of memory cells to be programmed simultaneously.

In accordance with the "body effect," applying a source to substrate bias voltage (a bias voltage applied between the source and substrate of the cell) has the effect of increasing the threshold voltage of a field effect transistor. The present inventors have discovered that applying a small source bias voltage to the cells of a flash EEPROM has the effect of substantially cutting off background leakage current during application of the programming pulses, or at least reducing the leakage current by a substantial amount. In addition, the present inventors have discovered that applying a small source bias voltage to the cells of a flash EEPROM in combination with a ramped programming pulse while maintaining the voltage differential between the control gate and the source has not only the effect of substantially cutting off background leakage current during application of the programming pulses but, in addition, maintains programming speed and is an effective power management technique.

The present inventors have discovered that in the context of programming a flash EEPROM there is a particular value of source bias that will substantially shut off background leakage current during programming, or at least reduce the leakage current to a manageable value, without reducing the programming speed. The actual value of source bias depends on the parameters of a particular application, and can be determined empirically, by computer simulation, or by a combination thereof.

As described above, the background leakage current is also present during programming in a conventional flash EEPROM. For this reason, a source bias voltage is also applied during the application of programming pulses. For programming, a voltage on the order of 7–12 volts is applied to the control gate of a cell or cells being programmed. The present inventors have determined that a source bias voltage on the order of 0.5 volts is sufficient to substantially shut off background leakage current during programming.

Figure 10:
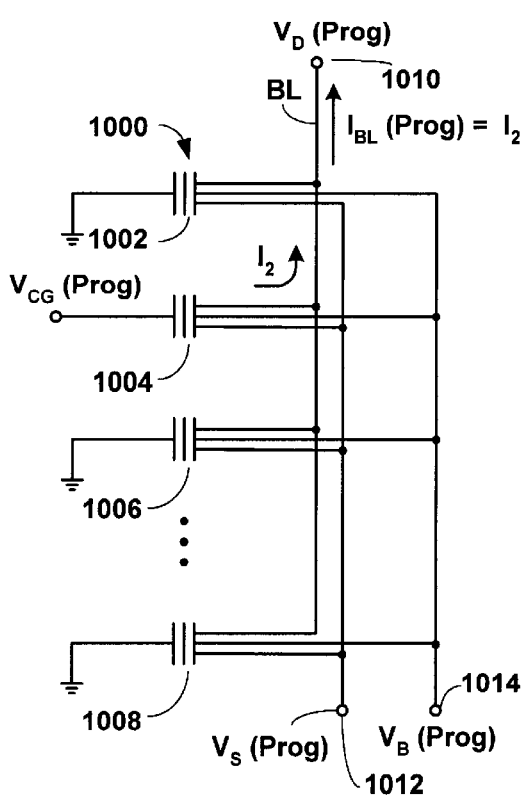
FIG. 10 is a simplified electrical schematic diagram of a column of flash EEPROM cells showing a method of applying programming voltages to cells selected to be programmed and to the cells not selected to be programmed.

The source bias can be applied in several ways in accordance with the present invention. FIG. 10 illustrates how the required voltages for programming can be directly applied to a column 1000 of memory cells. There are shown four memory cells in FIG. 10, memory cells 1002, 1004, 1006 and 1008. The memory cells 1002, 1004, 1006 and 1008 each have a drain connected to a bitline (BL) and thus have a common drain terminal 1010. The memory cells 1002, 1004, 1006 and 1008 each have a source connected to a terminal 1012 and thus have a common source terminal. The memory cells 1002, 1004, 1006 and 1008 each have a well (not shown) connected to a terminal 1014 and thus have a common well terminal. In order to limit the current $I_{BL}$ (Programming), (the bitline current during programming) to the current from the memory cell 1004 being programmed, TABLE 1 tabulates the programming voltages that can be applied to the terminals of the cells in the column 1000. As discussed above, the proper selection of a time-varying voltage applied to the control gates of memory cells being programmed and the source bias voltage reduces the programming current from cells being programmed and substantially eliminates the current from cells not being programmed.

It is further within the scope of the present invention to apply a back bias voltage to the source in the form of a negative voltage applied to the substrate or body or a combination of a source bias voltage applied directly to the source and a back bias voltage applied to the substrate or body. In an arrangement in which NMOS transistor cells, for example, are formed in P-type wells in a semiconductor substrate, a negative voltage can be applied to the P-wells. This is also tabulated in the following TABLE 1.

TABLE 1

| | PROGRAMMING VOLTAGES | | | | | |
|---|---|---|---|---|---|---|
| Embodiment | $V_{CGP}$ | $V_{CGN}$ | | $V_D$ | $V_S$ | $V_B$ |
| 1 | ramped | 0 | approx. | 5 | 0.5 | 0 |
| 2 | ramped | 0 | approx. | 5 | 0 | −0.5 |

Wherein $V_{CGP}$ is the voltage applied to the control gates of cells being programmed, $V_{CGN}$ is the voltage applied to the control gates of cells not being programmed, $V_D$ is the voltage applied to the common drain terminal of all of the cells, $V_S$ is the voltage applied to the common source terminal and $V_B$ is the voltage applied to the common well terminal.

Figure 11:
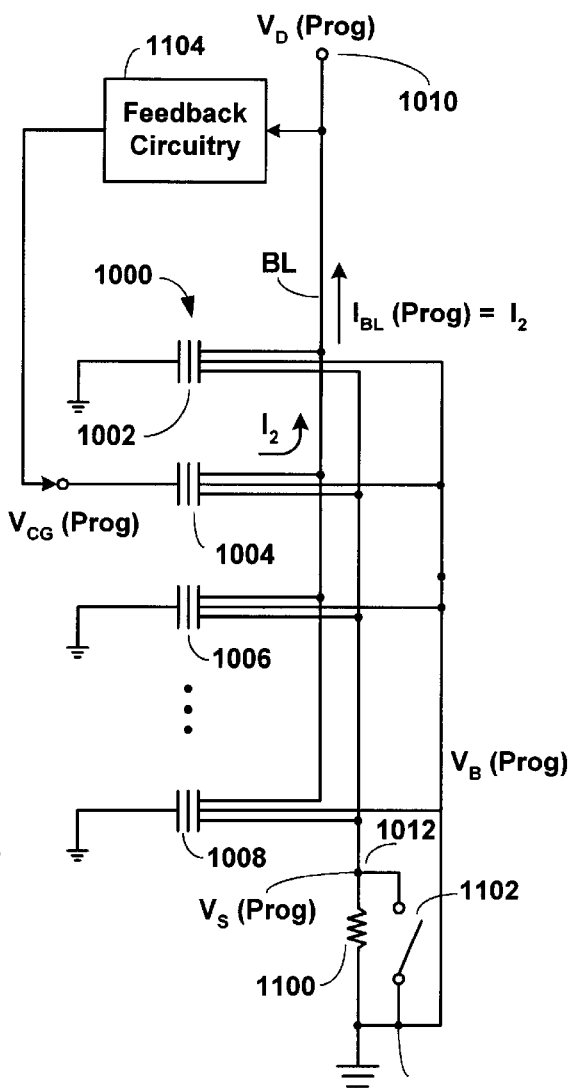
FIG. 11 is similar to FIG. 10 but shows an alternative method of applying programming voltages to cells selected and not selected to be programmed.

FIG. 11 illustrates how the source bias can alternatively be generated by a resistor 1100 that is connected between the common source terminal 1012 of the column of cells 1000 and the substrate (ground). Current flow through the cell 1004 and resistor 1100 creates a voltage drop across the resistor 1100. The value of the resistor 1100 can be calculated using Ohm's Law as being equal to the desired source bias voltage divided by the cell drain current. When it is desired to connect the source directly to the substrate of the cell 1004, the resistor 1100 can be shorted out as symbolically indicated by a switch 1102. The resistor 1100 can be connected between the common source connection of all the cells and the substrate. Alternatively, a number of resistors can be connected between the common source connections of groups of cells and the substrate respectively.

FIG. 11 also shows feedback circuitry 1104 that has an input from the bitline current BL that is proportional to the bitline current $I_{BL}$. The feedback circuitry 1104 provides dynamic control of the voltage applied to the control gate of the cells that are being programmed by monitoring the bitline current $I_{BL}$. For example, if the feedback circuitry 1104 determines that the bitline current $I_{BL}$ is too high (and thus the power requirement is too high) the voltage applied to the control gate of the cells being programmed can be lowered.

Various modifications will become apparent for those skilled in the art after receiving the teachings of the present disclosure without departing from the scope thereof. For example, although the invention has been described as being applied to the memory as illustrated in FIG. 1A, it is also applicable to a memory as illustrated in FIG. 1B in which the cells are arranged in a plurality of banks.

In summary, the results and advantages of the method and device of the present invention can now be more fully realized. The described device and method effectively provides a device and method that allows for the efficient programming of multiple memory cells by reducing loading in the bitlines by reducing current flowing in cells being programmed and by substantially eliminating the leakage current flowing in cells not being programmed.

The foregoing description of the embodiments of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of programming a memory device comprising multiple banks of memory cells, each bank having multiple memory cells each having a control gate and a floating gate formed over a substrate and each having a source and a drain formed in the substrate, wherein the drains have a common drain terminal and wherein the sources have a common source terminal, the method comprising:

selecting at least one bank of memory cells;

applying a voltage to the common drain terminal;

applying a time varying voltage to the control gates of memory cells that are to be programmed, wherein the voltage applied to the control gates of memory cells that are to be programmed is increased until a predetermined programming voltage is reached at which time the voltage applied to the control gates of memory cells that are to be programmed is removed; and applying a bias voltage to the common source terminal, wherein the bias voltage applied to the common source terminal in combination with the voltage applied to the control gates of the memory cells that are to be programmed substantially prevents background leakage current during application of the voltage applied to the control gates and maintains programming speed.

2. The method of claim 1 wherein the step of applying a time varying voltage to the control gates of the memory cells to be programmed comprises applying a voltage in the shape of a ramp function to the control gates of the memory cells that are to be programmed.

3. The method of claim 1 wherein the step of applying a time varying voltage to the control gates of the memory cells that are to be programmed comprises applying a voltage in the shape of a steadily increasing step function to the control gates of the memory cells that are to be programmed.

4. The method of claim 1 further comprising selecting the bias voltage applied to the common source terminal and selecting the time-varying voltage applied to the control gates of the memory cells that are to be programmed is accomplished so that the total power required for programming is below a predetermined value.

5. The method of claim 4 further comprising selecting the bias voltage applied to the common source terminal and selecting the time-varying voltage applied to the control gates of the memory cells that are to be programmed is accomplished so that programming current flowing through cells being programmed is reduced below a value of programming current that would flow without the time-varying voltage applied to the control gates of the memory cells that are to be programmed and wherein the total leakage current from memory cells that are not to be programmed is below the leakage current with no bias voltage applied to the common source terminal.

6. The method of claim 1 further comprising selecting at least a second bank.

7. The method of claim 6 further comprising selecting the bias voltage applied to the common source terminal and selecting the time-varying voltage applied to the control gates of the memory cells that are to be programmed is accomplished so that the total power required for programming is below a predetermined value.

8. The method of claim 7 further comprising monitoring current flowing into the common drain terminal and adjusting the time-varying voltage applied to the control gates of the memory cells that are to be programmed so that the total power required for programming remains below the predetermined value.

9. A method of programming a memory device, comprising multiple memory cells each having a control gate and a floating gate formed over a substrate and each having a source and a drain formed in a well region formed in the substrate, wherein the drains have a common drain terminal and wherein the sources have a common source terminal and wherein the well regions have a common terminal, the method comprising:

selecting at least one bank of memory cells;

applying a voltage to the common drain terminal;

applying a time varying voltage to the control gates of memory cells that are to be programmed, wherein the voltage applied to the control gates of memory cells that are to be programmed is increased until a predetermined programming voltage is reached at which time the voltage applied to the control gates of memory cells that are to be programmed is removed;

applying a bias voltage to the common well terminal; and applying a bias voltage to the common source terminal, wherein the bias voltage applied to the common well terminal and the bias voltage applied to the common source terminal in combination with the voltage applied to the control gates of the memory cells that are to be programmed substantially prevents background leakage current during application of the voltage applied to the control gates and maintains programming speed.

10. The method of claim 9 wherein the step of applying a time varying voltage to the control gates of the memory cells to be programmed comprises applying a voltage having the shape of a steadily increasing step function to the control gates of the memory cells that are to be programmed.

11. The method of claim 9 wherein the step of applying a time varying voltage to the control gates of the memory cells to be programmed comprises applying a voltage having a shape of a steadily increasing step function to the control gates of the memory cells that are to be programmed.

12. The method of claim 9 further comprising selecting the bias voltage applied to the common well terminal and selecting the time-varying voltage applied to the control gates of the memory cells that are to be programmed is accomplished so that the total power required for programming is below a predetermined value.

13. The method of claim 9 further comprising selecting the bias voltage applied to the common well terminal and selecting the time-varying voltage applied to the control gates of the memory cells that are to be programmed is accomplished so that programming current flowing through cells being programmed is reduced below a value of programming current that would flow without the time-varying voltage applied to the control gates of the memory cells that are to be programmed and wherein the total leakage current from memory cells that are not to be programmed is below the leakage current with no bias voltage applied to the common well terminal.

14. The method of claim 9 further comprising selecting at least a second bank.

15. The method of claim 14 further comprising selecting the bias voltage applied to the common source terminal and selecting the time-varying voltage applied to the control gates of the memory cells that are to be programmed is accomplished so that the total power required for programming is below a predetermined value.

16. The method of claim 15 further comprising monitoring current flowing into the common drain terminal and adjusting the time-varying voltage applied to the control gates of the memory cells that are to be programmed so that the total power required for programming remains below the predetermined value.

17. A memory device, comprising:

multiple banks, each bank having multiple memory cells each cell having a control gate and a floating gate formed over a substrate and each having a source and a drain formed in the substrate, wherein the drains have a common drain terminal and wherein the sources have a common source terminal; and programming circuitry that selects at least one bank, that applies a voltage to the common drain terminal, that applies a time varying voltage to control gates of memory cells that are to be programmed, wherein the programming circuitry increases the voltage applied to the control gates of the memory cells that are to be programmed until a predetermined programming voltage is reached at which time the programming circuitry removes the voltage applied to the control gates of memory cells that are to be programmed; and wherein the programming circuitry applies a bias voltage to the common source terminal wherein the bias voltage applied to the common source terminal by the programming circuitry in combination with the voltage applied to the control gates of the memory cells that are to be programmed substantially prevents background leakage current and maintains programming speed during application of the voltage applied to the control gates.

18. The memory device of claim 17 wherein the circuitry includes circuitry that applies a ramp function to the control gates of the memory cells that are to be programmed.

19. The memory device of claim 17 wherein the circuitry includes circuitry that applies a steadily increasing step function to the control gates of the memory cells that are to be programmed.

20. The memory device of claim 17 wherein the circuitry includes circuitry that applies a bias voltage to the common source terminal and a voltage to the control gates of the memory cells that are to be programmed wherein the voltages are selected so that the total power required for programming is below a predetermined value.

21. The memory device of claim 17 wherein the circuitry includes circuitry that applies a bias voltage to the common source terminal and a voltage to the control gates of the memory cells that are to be programmed wherein the voltages are selected so that the programming current flowing through cells being programmed is reduced below a value of programming current that would flow without the time-varying voltage applied to the control gates of the memory cells that are to be programmed and wherein leakage current from memory cells that are not to be programmed is below a selected value of leakage current.

22. The memory device of claim 17 wherein the programming circuitry includes circuitry that selects at least a second bank.

23. The memory device of claim 22 wherein the circuitry includes circuitry that applies a bias voltage to the common source terminal and a voltage to the control gates of the memory cells that are to be programmed wherein the voltages are selected so that the total power required for programming is below a predetermined value.

24. The memory device of claim 23 further comprising feedback circuitry that monitors current flowing into the common drain terminal and adjusts the time-varying voltage applied to the control gates of the memory cells that are to be programmed so that the total power required for programming remains below the predetermined value.

* * * * *